(12) United States Patent
Asaoka et al.

(10) Patent No.: US 12,550,521 B2
(45) Date of Patent: Feb. 10, 2026

(54) DISPLAY DEVICE

(71) Applicant: SHARP KABUSHIKI KAISHA, Sakai (JP)

(72) Inventors: Yasushi Asaoka, Sakai (JP); Shigeru Aomori, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 651 days.

(21) Appl. No.: 17/801,663

(22) PCT Filed: Mar. 11, 2020

(86) PCT No.: PCT/JP2020/010612
§ 371 (c)(1),
(2) Date: Aug. 23, 2022

(87) PCT Pub. No.: WO2021/181575
PCT Pub. Date: Sep. 16, 2021

(65) Prior Publication Data
US 2023/0125164 A1   Apr. 27, 2023

(51) Int. Cl.
*H10K 50/16* (2023.01)
*H10K 50/115* (2023.01)
*H10K 50/15* (2023.01)
*H10K 59/35* (2023.01)

(52) U.S. Cl.
CPC ........... *H10K 50/115* (2023.02); *H10K 50/15* (2023.02); *H10K 50/166* (2023.02); *H10K 59/353* (2023.02)

(58) Field of Classification Search
CPC .... H10K 59/353; H10K 59/35; H10K 59/352; H10K 85/341–348; H10K 2101/10; H10K 2101/30
See application file for complete search history.

(56) References Cited

U.S. PATENT DOCUMENTS

| | | | |
|---|---|---|---|
| 2005/0088104 A1* | 4/2005 | Hamada | H10K 59/12 315/169.3 |
| 2013/0069036 A1 | 3/2013 | Miyata | |
| 2014/0175390 A1* | 6/2014 | Kim | H10K 50/80 438/34 |
| 2015/0060829 A1* | 3/2015 | Heo | H10K 50/171 257/40 |
| 2020/0357863 A1* | 11/2020 | Nakamura | H10K 59/352 |
| 2021/0020862 A1* | 1/2021 | Nishiguchi | H10K 59/35 |

FOREIGN PATENT DOCUMENTS

| | | | |
|---|---|---|---|
| CN | 109742105 A | 5/2019 | |
| CN | 109742105 B * | 12/2020 | |
| JP | 2010165587 A * | 7/2010 | |
| WO | 2011/148791 A1 | 12/2011 | |
| WO | WO-2019090733 A1 * | 5/2019 | ........... H10K 50/125 |
| WO | WO-2019198164 A1 * | 10/2019 | ........... H01L 27/3211 |

\* cited by examiner

*Primary Examiner* — Steven B Gauthier
*Assistant Examiner* — Adam D Weiland
(74) *Attorney, Agent, or Firm* — ScienBiziP, P.C.

(57) ABSTRACT

In a display device, a first power supply voltage line includes a first trunk wiring line, a plurality of branch wiring lines, and a second power supply voltage line includes a second trunk wiring line. The first trunk wiring line includes a first portion and a second portion. A line width of the first portion is smaller than a line width of the second portion. A frame region in a frame region provided with the first portion includes a first irregular frame edge having an irregular shape.

20 Claims, 34 Drawing Sheets

DISPLAY DEVICE

TECHNICAL FIELD

The disclosure relates to a display device.

BACKGROUND ART

There is known a display device in which a function layer such as a hole transport layer and an electron transport layer is formed in common to all subpixels (PTL 1). On the other hand, depending on the type of subpixels, it may be desired to form a different function layer on a subpixel-by-subpixel basis in order to improve recombination efficiency of positive holes injected from an anode electrode and electrons injected from a cathode electrode in a light-emitting layer.

CITATION LIST

Patent Literature

PTL 1: WO 2011/148791 pamphlet (published on Dec. 1, 2011)

SUMMARY

Technical Problem

However, in a case where a different function layer is formed for each subpixel, chipping or peeling may occur at an edge portion of the function layer, which is a problem.

Solution to Problem

A display device according to an aspect of the disclosure includes a pixel electrode formed on a subpixel-by-subpixel basis, a common electrode, a light-emitting layer formed between the pixel electrode and the common electrode, and a first function layer and a second function layer formed between the light-emitting layer and the pixel electrode or between the light-emitting layer and the common electrode, and continuously formed across a plurality of the subpixels, wherein the plurality of subpixels include a first subpixel configured to emit a first color light and a second subpixel configured to emit a second color light having a wavelength longer than the first color, the second function layer overlaps an entirety of the pixel electrode of the second subpixel in a plan view, and the first function layer overlaps an entirety of the pixel electrode of the first subpixel in a plan view, and includes an opening overlapping, in a plan view, an inner side of a peripheral edge portion of the pixel electrode of the second subpixel.

Advantageous Effects of Disclosure

According to an aspect of the disclosure, occurrence of chipping and peeling at a pixel edge portion of a function layer can be prevented.

DESCRIPTION OF EMBODIMENTS

In the following description, the "same layer" means that it is formed through the same process (film formation step), the "lower layer" means that it is formed through a process before that of the compared layer, and the "upper layer" means that it is formed through a process after that of the compared layer.

Figure 1:
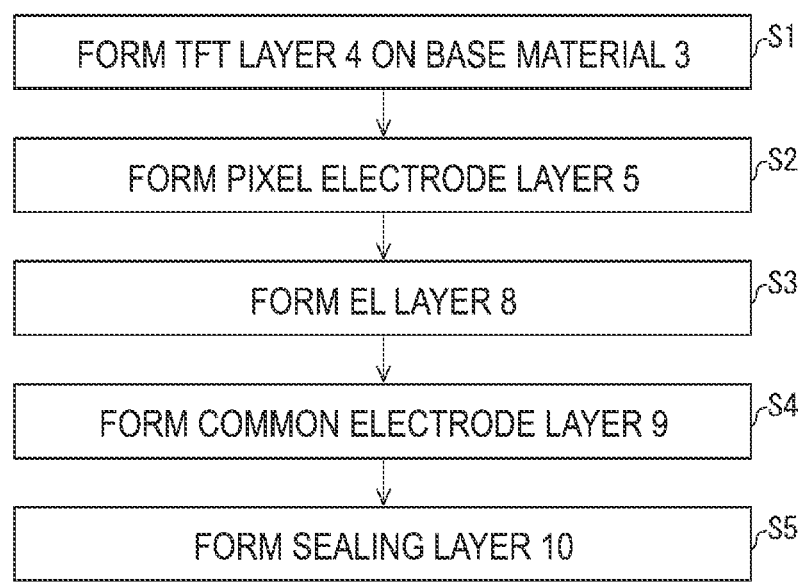
FIG. 1 is a flowchart of an example of a manufacturing method of a display device.
Figure 2:
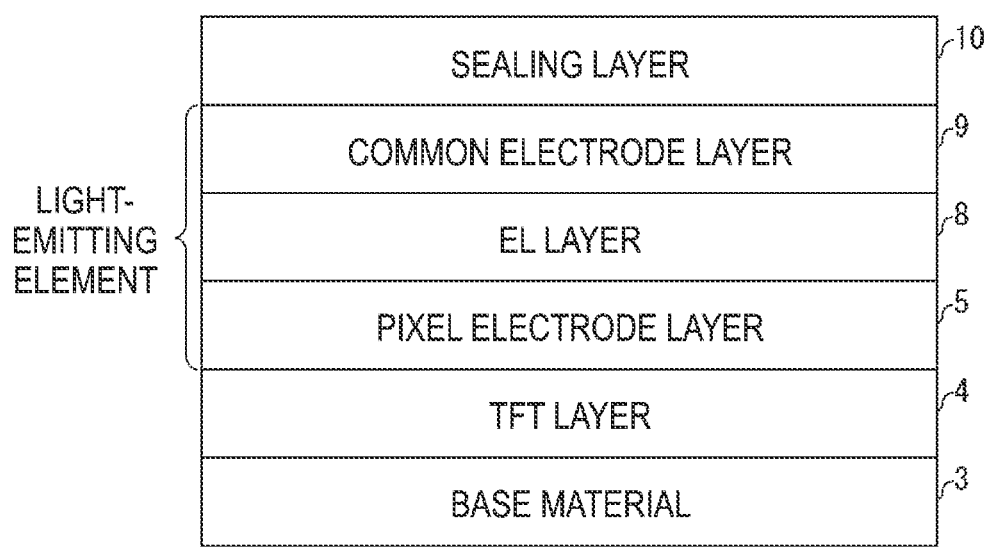
FIG. 2 is a schematic view illustrating a cross-section configuration of the display device.

FIG. 1 is a flowchart illustrating an example of a manufacturing method of a display device, and FIG. 2 is a schematic view illustrating a cross-section configuration of the display device. As illustrated in FIGS. 1 and 2, in manufacturing the display device, first, a thin film transistor (TFT) layer 4 is formed on a base material 3 (step S1). Next, a pixel electrode layer 5 is formed (step S2). Next, an electroluminescence (EL) layer 8 is formed (step S3). The EL layer 8 may be formed by a photolithographic method, or by a vapor deposition using a fine metal mask (FMM), for example. Next, a common electrode layer 9 is formed (step S4). Next, a sealing layer 10 is formed (step S5). Steps S1 to S4 are performed by a display device manufacturing apparatus (including a film formation apparatus that performs step S3).

One of the pixel electrode layer 5 or the common electrode layer 9 acts as a cathode electrode for injecting electrons, and an electron transport layer is formed between the cathode electrode and the EL layer 8. In other words, in a case where the pixel electrode layer 5 is the cathode electrode, the electron transport layer is formed after step S2, and then step S3 is performed. In a case where the common electrode layer 9 is the cathode electrode, the electron transport layer is formed after step S3, and then step S4 is performed.

Glass or a resin such as polyimide can be used for the base material 3. A barrier film made of silicon nitride or the like may be formed by film formation on the glass or resin to form the base material 3.

The TFT layer 4 is provided with a semiconductor layer, a plurality of metal layers, and a plurality of insulating layers, and a plurality of thin film transistors (TFTs) are formed. A control circuit for a light-emitting element (for example, a light emitting diode) including the pixel electrode layer 5, the EL layer 8, and the common electrode layer 9 is formed in the TFT layer 4.

The pixel electrode layer 5 includes a plurality of pixel electrodes having light reflectivity, the EL layer 8 includes a plurality of light-emitting layers (e.g., quantum dot layers, organic light-emitting layers), and the common electrode layer 9 includes a common electrode having optical transparency.

The pixel electrode layer 5 is formed by layering Indium Tin Oxide (ITO) and aluminum (Al), or silver (Ag) or an alloy containing Ag, for example. The common electrode layer 9 is formed of an Mg—Ag alloy (ultra-thin film), ITO, indium zinc oxide (IZO), and silver nanowires, for example.

A work function differs between the pixel electrode layer 5 and the common electrode layer 9. The pixel electrode layer 5 may be on an anode side (high-voltage side) and the common electrode layer 9 may be on cathode side (low-voltage side), or the pixel electrode layer 5 may be on the cathode side (low-voltage side) and the common electrode layer 9 may be on the anode side (high-voltage side).

In a display region of the display device, a plurality of light-emitting elements including the pixel electrode layer 5, the EL layer 8, and the common electrode layer 9 are provided, and a driver that drives the TFT layer 4 and the like is provided to an outside of the display region (frame region).

In a case where the light-emitting element is a quantum dot light emitting diode (QLED), positive holes and electrons recombine inside the light-emitting layer in response to a drive current between the pixel electrode and the common electrode, and when excitons generated due to this recombination transition from a conduction band to a valence band of the quantum dots, light (fluorescence) is emitted. Since the common electrode is transparent and the pixel electrode is light-reflective, the light emitted from the EL layer 8 travels upwards and results in top-emitting.

In a case where the light-emitting element is an organic light-emitting diode (OLED), positive holes and electrons recombine inside the light-emitting layer in response to a drive current between the pixel electrode and the common electrode, and when excitons generated due to this recombination transition to a ground state, light is emitted. The light-emitting element is not limited to QLED or OLED, and may be an inorganic light emitting diode or the like.

The transparent sealing layer 10 includes an inorganic insulating film made of silicon nitride or the like, and inhibits foreign matters such as water and oxygen from infiltrating to the light-emitting element.

First Embodiment

Figure 3:
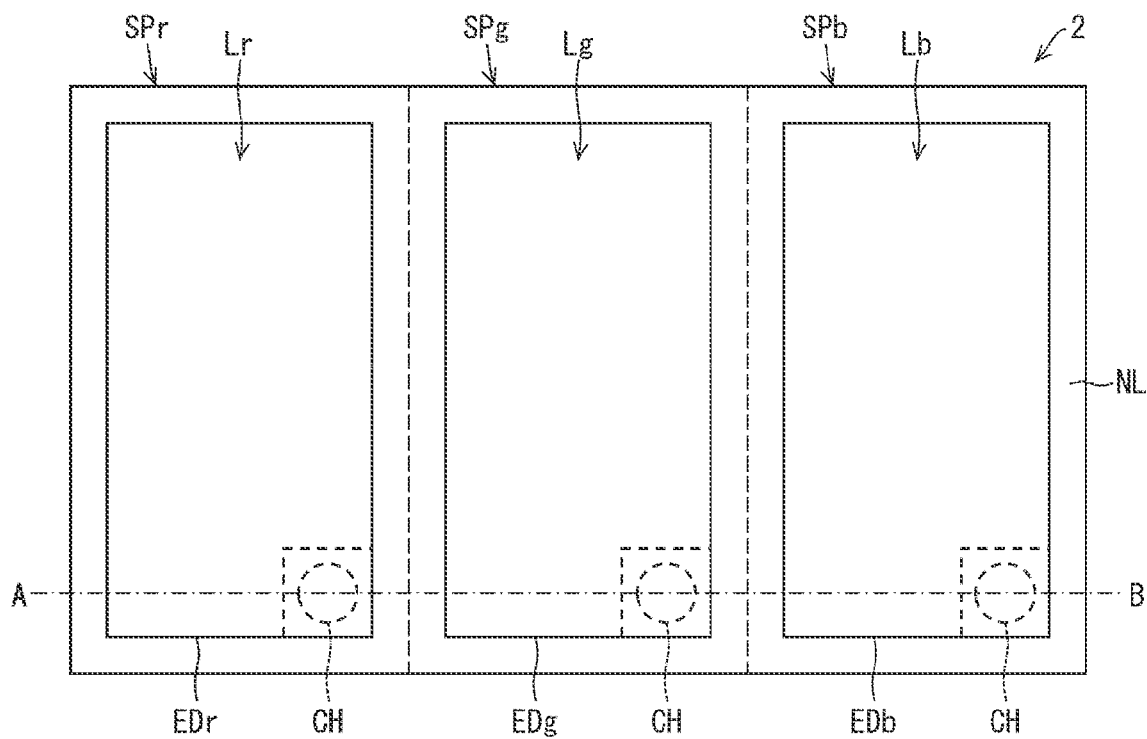
FIG. 3 is a plan view illustrating subpixels provided in the display device according to a first embodiment.
Figure 4:
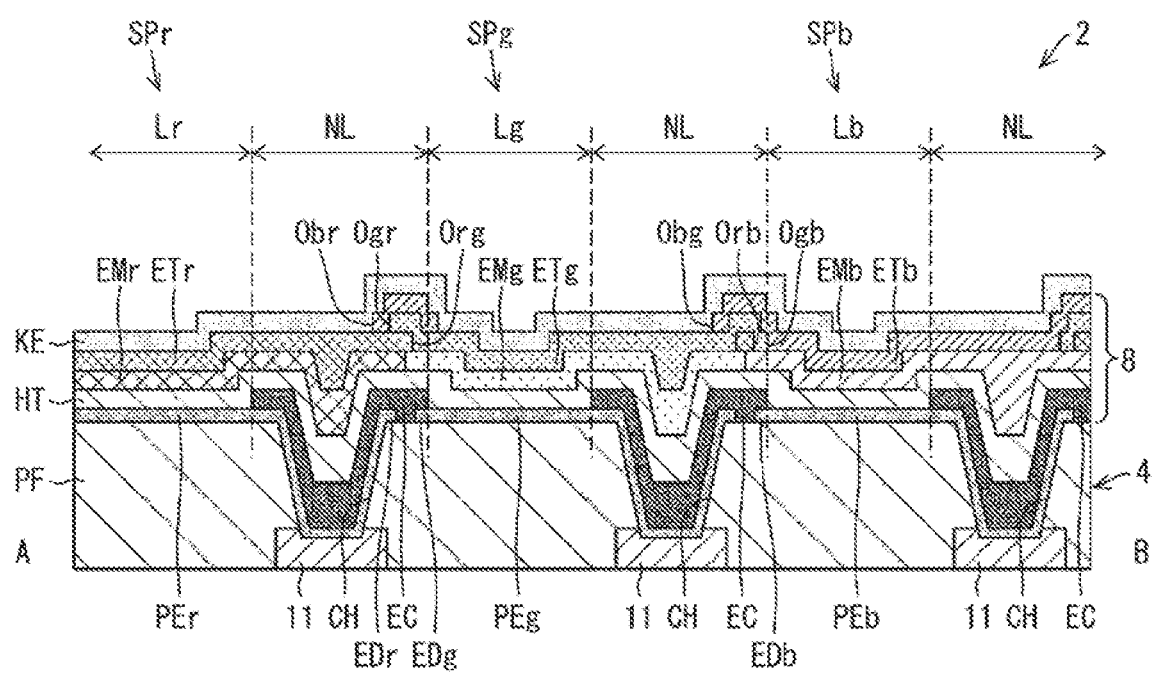
FIG. 4 is a cross-sectional view taken along a plane A-B illustrated in FIG. 3.
Figure 5:
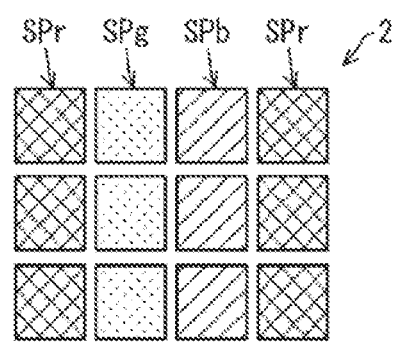
FIG. 5 is a plan view illustrating an arrangement of the subpixels.
Figure 6:
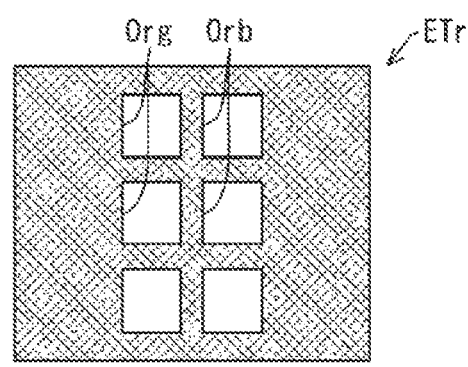
FIG. 6 is a plan view illustrating a pattern of an electron transport layer for a red light-emitting layer provided in the display device.
Figure 7:
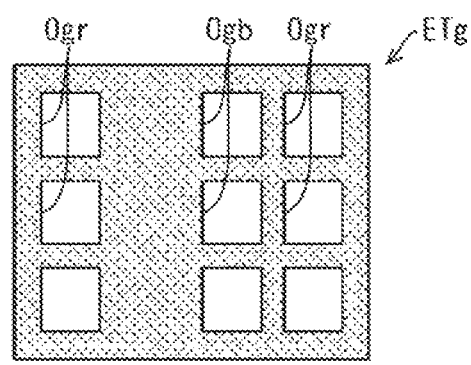
FIG. 7 is a plan view illustrating a pattern of an electron transport layer for a green light-emitting layer provided in the display device.
Figure 8:
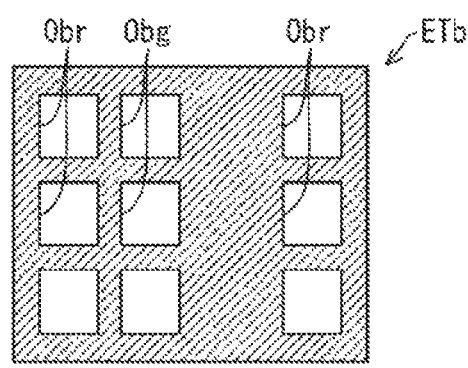
FIG. 8 is a plan view illustrating a pattern of an electron transport layer for a blue light-emitting layer provided in the display device.

FIG. 3 is a plan view illustrating subpixels SPr, SPg, and SPb provided in a display device 2 according to a first embodiment. FIG. 4 is a cross-sectional view taken along a plane A-B illustrated in FIG. 3. FIG. 5 is a plan view illustrating an arrangement of the subpixels SPr, SPg, and SPb. FIG. 6 is a plan view illustrating a pattern of an electron transport layer ETr for a red light-emitting layer EMr provided in the display device 2. FIG. 7 is a plan view illustrating a pattern of an electron transport layer ETg for a green light-emitting layer EMg provided in the display device 2. FIG. 8 is a plan view illustrating a pattern of an electron transport layer ETb for a blue light-emitting layer EMb provided in the display device 2.

The display device 2 includes the subpixel SPr (first subpixel) for emitting light of a red color (first color), the subpixel SPg (second subpixel) for emitting light of a green color (second color), and the subpixel SPb (third subpixel) for emitting light of a blue color (third color).

The subpixel SPr includes a light-emitting region Lr, the subpixel SPg includes a light-emitting region Lg, and the subpixel SPb includes a light-emitting region Lb. A non-light-emitting region NL is disposed to surround each of the light-emitting regions Lr, Lg, and Lb.

Pixel electrodes PEr, PEg, and PEb are formed in the subpixels SPr, SPg, and SPb, respectively. A common electrode KE is formed in common to the subpixels SPr, SPg, and SPb. The common electrode KE may be the cathode. The pixel electrodes PEr, PEg, and PEb may be the anodes.

The red light-emitting layer EMr is formed between the pixel electrode PEr and the common electrode KE. The green light-emitting layer EMg is formed between the pixel electrode PEg and the common electrode KE. The blue light-emitting layer EMb is formed between the pixel electrode PEb and the common electrode KE.

The electron transport layers ETr, ETg, and ETb (the third function layer, the second function layer, and the first function layer) are continuously and integrally formed across the subpixel SPr, subpixel SPg, and subpixel SPb between the red light-emitting layer EMr and the common electrode KE, between the green light-emitting layer EMg and the common electrode KE, and between the blue light-emitting layer EMb and the common electrode KE.

The electron transport layer ETg (second function layer) overlaps the entirety of the pixel electrode of the pixel electrode PEg of the subpixel SPg (second subpixel) in a plan view. The electron transport layer ETr (third function layer) overlaps the entirety of the pixel electrode PEr of the subpixel SPr (third subpixel) in a plan view and includes an opening Org that overlaps an inner side of a peripheral edge portion EDg of the pixel electrode PEg of the subpixel SPg (second subpixel) in a plan view. That is, a center portion of the opening Org and a center portion of the pixel electrode PEg overlap each other in a plan view. Furthermore, the electron transport layer ETr (third function layer) overlaps the entire periphery of the peripheral edge portion EDg of the pixel electrode PEg of the subpixel SPg (second subpixel) in a plan view.

The electron transport layer ETr (third function layer) includes an opening Orb that overlaps an inner side of a peripheral edge portion EDb of the pixel electrode PEb of the subpixel SPb (first subpixel) in a plan view. That is, a center portion of the opening Orb and a center portion of the pixel electrode PEb overlap each other in a plan view. The electron transport layer ETr (third function layer) overlaps the entire periphery of the peripheral edge portion EDb of the pixel electrode PEb of the subpixel SPb (first subpixel) in a plan view.

The electron transport layer ETg (second function layer) includes an opening Ogr that overlaps the inner side of a peripheral edge portion EDr of the pixel electrode PEr of the subpixel SPr (third subpixel) in a plan view, and includes an opening Ogb inside the peripheral edge portion EDb of the pixel electrode PEb of the subpixel SPb (first subpixel). That is, a center portion of the opening Ogr and a center portion of the pixel electrode PEr overlap each other, and a center portion of the opening Ogb and the center portion of the pixel electrode PEb overlap each other. The electron transport layer ETg (second function layer) overlaps the entire peripheries of the peripheral edge portion EDr of the pixel electrode PEr of the subpixel SPr (third subpixel) and the peripheral edge portion EDb of the pixel electrode PEb of the subpixel SPb (first subpixel).

The electron transport layer ETb (first function layer) is adjacent to the electron transport layer ETg (second function layer), and overlaps the entirety of the pixel electrode PEb of the subpixel SPb (first subpixel) in a plan view.

The electron transport layer ETb (first function layer) includes an opening Obr that overlaps the inner side of the peripheral edge portion EDr of the pixel electrode PEr of the subpixel SPr (third subpixel) in a plan view, and includes an opening Obg that overlaps the inner side of the peripheral edge portion EDg of the pixel electrode PEg of the subpixel SPg (second subpixel) in a plan view. That is, a center portion of the opening Obr and the center portion of the pixel electrode PEr overlap each other in a plan view, and a center portion of the opening Obg and the center portion of the pixel electrode PEg overlap each other in a plan view. The electron transport layer ETb (first function layer) overlaps, in a plan view, the entire peripheries of the peripheral edge portion EDr of the pixel electrode PEr of the subpixel SPr (third subpixel) and the peripheral edge portion EDg of the pixel electrode PEg of the subpixel SPg (second subpixel).

In a case where the pixel electrode and the common electrode are close to each other at the peripheral edge portion of the pixel electrode, an electric field is concentrated at the peripheral edge portion of the pixel electrode to flow an excess current, and thus the peripheral edge portion of the pixel electrode may be degraded, and the light-emitting region of the subpixel may be narrowed.

On the other hand, even in a case where the function layer includes an opening formed in the center portion of the pixel electrode, the plurality of function layers are formed to overlap each other at the entire periphery of the pixel electrode in a plan view as described above, and thus the common electrode is prevented from being close to the peripheral edge portion of the pixel electrode. Thus, the excess current flow due to the concentration of the electric field in the peripheral edge portion of the pixel electrode can be prevented, and a narrowing of the light-emitting region of the subpixel due to the degradation of the peripheral edge portion of the pixel electrode can be prevented.

A hole transport layer HT is formed between the red light-emitting layer EMr and the pixel electrode PEr, between the green light-emitting layer EMg and the pixel electrode PEg, and between the blue light-emitting layer EMb and the pixel electrode PEb.

The pixel electrodes PEr, PEg, and PEb are respectively formed on an organic insulating film PF (a flattening film made of polyimide or the like), which is an uppermost layer of the TFT layer 4, and are connected to transistors 11 in contact holes CH formed in the TFT layer 4 respectively corresponding to the subpixels SPr, SPg, and SPb.

Edge covers EC covering edges of the pixel electrodes PEr, PEg, and PEb are provided.

As described above, the common electrode KE is formed across a plurality of the subpixels SPr, SPg, and SPb. The red light-emitting layer EMr, the green light-emitting layer EMg, and the blue light-emitting layer EMb are separately applied for the pixel electrodes PEr, PEg, and PEb, respectively, and are formed so as to also run on a part of the edge cover EC. The red light-emitting layer EMr, the green light-emitting layer EMg, and the blue light-emitting layer EMb may contain the quantum dots.

Three types of electron transport layers ETr, ETg, and ETb suitable for the red light-emitting layer EMr, the green light-emitting layer EMg, and the blue light-emitting layer EMb, respectively, are formed between the common electrode KE and the red light-emitting layer EMr, the green light-emitting layer EMg, and the blue light-emitting layer EMb.

The pixel electrodes PEr, PEg, and PEb are respectively provided for the subpixel SPr, SPg, and SPb, and a voltage is applied to each of the pixel electrodes PEr, PEg, and PEb, the voltage being different from a voltage applied to the pixel electrodes PEr, PEg, and PEb adjacent to the corresponding pixel electrodes PEr, PEg, and PEb.

The edge cover EC is formed of an insulating material and is formed so as to cover the contact hole CH, the peripheral edge portion EDr of the pixel electrode PEr, the peripheral edge portion EDg of the pixel electrode PEg, and the peripheral edge portion EDb of the pixel electrode PEb.

One of the common electrode KE and the pixel electrodes PEr, PEg, and PEb has visible optical transparency. Work functions of the pixel electrodes PEr, PEg, and PEb and a work function of the common electrode KE are different from each other. The transistor 11 is connected to each of the pixel electrodes PEr, PEg, and PEb.

A hole injection layer (HIL) may be provided between the red light-emitting layer EMr and the pixel electrode PEr, between the green light-emitting layer EMg and the pixel electrode PEg, and between the blue light-emitting layer EMb and the pixel electrode PEb. The subpixels SPr, SPg, and SPb having plurality of types of luminescent color are disposed adjacent to each other.

As illustrated in FIG. 6, the electron transport layer ETr suitable for the red light-emitting layer EMr is patterned so as to include the openings Org for not covering the pixel electrode PEg corresponding to the green light-emitting layer EMg, and the openings Orb for not covering the pixel electrode PEb corresponding to the blue light-emitting layer EMb.

As illustrated in FIG. 7, the electron transport layer ETg suitable for the green light-emitting layer EMg is patterned so as to include the openings Ogr for not covering the pixel electrode PEr corresponding to the red light-emitting layer EMr, and the openings Ogb for not covering the pixel electrode PEb corresponding to the blue light-emitting layer EMb.

As illustrated in FIG. 8, the electron transport layer ETb suitable for the blue light-emitting layer EMb is patterned so as to include the openings Obg for not covering the pixel electrode PEg corresponding to the green light-emitting layer EMg, and the openings Obr for not covering the pixel electrode PEr corresponding to the red light-emitting layer EMr. This electron transport layer ETb overlaps the entirety of the pixel electrode PEb of the subpixel SPb (first subpixel).

In the electron transport layers ETr, ETg, and ETb configured in this manner, a protruding portion having an angle smaller than 180° is not included inside the pattern of a display area requiring fine pattern formation, and thus chipping and peeling are less likely to occur.

As described above, the electron transport layers ETr, ETg, and ETb are patterned across the entirety of the subpixels SPr, SPg, and SPb, and thus a contact area with an underlayer is wider than that of an electron transport layer patterned to be isolated in an island shape on a subpixel-by-subpixel basis. Thus, the electron transport layers ETr, ETg, and ETb are less likely to be peeled off from the underlayer.

In addition, in an electron transport layer patterned to be isolated in a quadrangular island shape, a portion of 270° outward around the corner thereof is exposed to a processing process, but in the electron transport layers ETr, ETg, and ETb including the quadrangular openings Org, Orb, Ogr, Ogb, Obr, and Obg across the entirety of the subpixels SPr, SPg, and SPb and patterned in solid-like, portions of 90° inward around the corners of the openings Org, Orb, Ogr, Ogb, Obr, and Obg are exposed to the processing process, and thus peeling at the corners can be suppressed.

Figure 9:
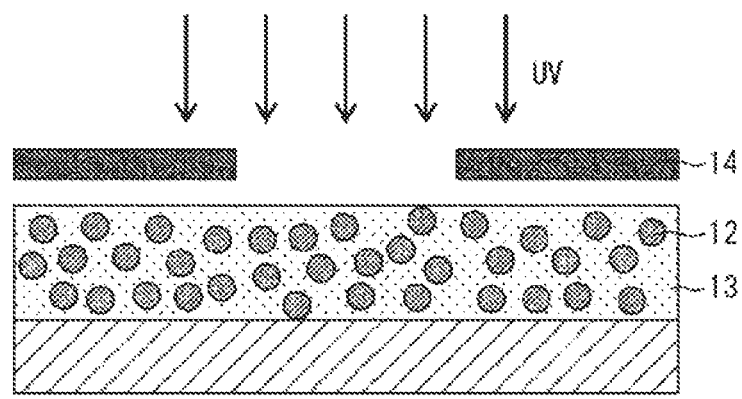
FIG. 9 is a cross-sectional view for describing a patterning method of the electron transport layer.
Figure 10:
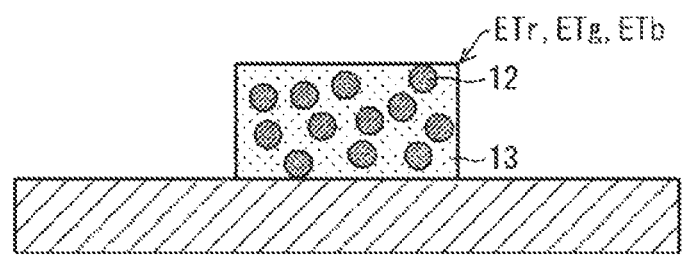
FIG. 10 is a cross-sectional view for describing a patterning method of the electron transport layer.

FIGS. 9 and 10 are cross-sectional views for describing a patterning method of the electron transport layers ETr, ETg, and ETb.

First, resist containing zinc oxide (ZnO) is applied to a thickness of from 20 nm to 100 nm. The resist contains a photosensitive resin 13 and nanoparticles 12 composed of zinc oxide (ZnO). Then, a solvent is evaporated, and the applied resist is pre-baked at from 80° C. to 120° C. to dry.

Next, the resist is expose with ultraviolet (UV) via a mask 14 under a condition of from 10 mJ/cm$^2$ to 1000 mJ/cm$^2$. Thereafter, development is performed using an alkaline solution, an organic solvent, or water. In the case of a positive-working resist, the UV irradiated portion of the resist is dissolved. On the other hand, in the case of a negative-working resist, the UV non-irradiated portion of the resist is dissolved. Then, the resist left remaining undissolved is subjected to main bake at from 100° C. to 200° C. If necessary, the main back suppresses gas emission of UV from the photosensitive resin 13 during the operation of the EL layer 8.

The electron transport layers ETr, ETg, and ETb formed in this manner contain the nanoparticle 12 of ZnO and the photosensitive resin 13. At the drive voltage of the EL layer 8, the conductivity of the photosensitive resin 13 is low.

In a case where the red light-emitting layer EMr, the green light-emitting layer EMg, and the blue light-emitting layer EMb contain CdSe-based nanoparticles, in the size of the nanoparticle 12 of ZnO used, the size of the nanoparticles 12 for the electron transport layer ETr is larger than the size of the nanoparticles 12 for the electron transport layer ETg, and the size of the nanoparticles 12 for the electron transport layer ETg is larger than the size of the nanoparticles 12 for the electron transport layer ETb. Furthermore, electron affinity increases in order of the nanoparticles 12 for the electron transport layer ETr, the nanoparticles 12 for the electron transport layer ETg, and the nanoparticles 12 for the electron transport layer ETb. For example, the size of the nanoparticles 12 for the electron transport layer ETr is larger than 6 nm, the size of the nanoparticles 12 for the electron transport layer ETg is 6 nm, and the size of the nanoparticles 12 for the electron transport layer ETb is 2 nm. As the nanoparticles used in the ETL layer, not only ZnO but also MgZnO nanoparticles to which Mg is added may be used. When Mg is added, the band gap can be larger than that of ZnO according to the added amount of Mg, and the electron affinity can be reduced. As described above, a zinc oxide compound such as ZnO and MgZnO can be used as the nanoparticles used in the ETL.

As the hole transport material for the hole transport layer HT, NiO nanoparticles and photocurable hole transport materials (X-F6-TAPC, QUPD, and OTPD) can be used.

In order to manufacture the display device 2 having the known structure including the electron transport layers ETr, ETg, and ETb, first, the edge cover EC is patterned on an AM substrate on which the anode pixel electrode is formed. Then, the hole injection layer and the hole transport layer HT are applied in this order. Next, the red light-emitting layer EMr, the green light-emitting layer EMg, and the blue light-emitting layer EMb are separately patterned for the subpixels SPr, SPg, and SPb, respectively, by a general method such as QD-PR and imprint.

Thereafter, the electron transport layer ETr is patterned and formed by the photoresist containing nanoparticles, the imprint, or the like. Then, the electron transport layer ETg is patterned and formed by the photoresist containing nanoparticles, the imprint, or the like. Next, the electron transport layer ETb is patterned and formed by the photoresist containing nanoparticles, the imprint, or the like. Thereafter, the common electrode KE is formed. Then, a sealing layer is formed.

In order to manufacture the display device 2 having an invert structure including the electron transport layers ETr, ETg, and ETb, first, the edge cover EC is patterned on an AM substrate on which a cathode pixel electrode is formed. Then, the electron transport layer ETr is patterned and formed by the photoresist containing nanoparticles, the imprint, or the like. Next, the electron transport layer ETg is patterned and formed by the photoresist containing nanoparticles, the imprint, or the like. Thereafter, the electron transport layer ETb is patterned and formed by the photoresist containing nanoparticles, the imprint, or the like.

Then, the red light-emitting layer EMr, the green light-emitting layer EMg, and the blue light-emitting layer EMb are separately patterned for the subpixels SPr, SPg, and SPb, respectively, by a general method such as the QD-PR and the imprint. Next, the hole transport layer HT and the hole injection layer are applied in this order. Thereafter, the common electrode KE is formed. Then, the sealing layer is formed. That is, in both the known structure and the invert structure, the electron transport layer ETb, the electron transport layer ETg, the electron transport layer ETr, and the cathode electrode are layered in this order from the light-emitting layer.

Figure 11:
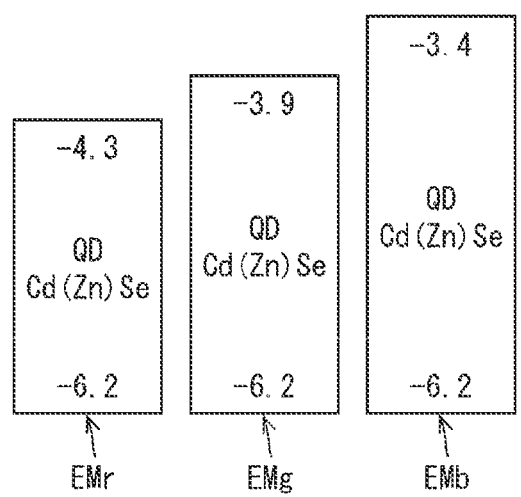
FIG. 11 is a diagram illustrating an example of energy levels of Cd-based quantum dots of the light-emitting layers.

FIG. 11 is a diagram illustrating an example of energy levels of Cd-based quantum dots of the red light-emitting layer EMr, the green light-emitting layer EMg, and the blue light-emitting layer EMb. In a case where the quantum dots of the red light-emitting layer EMr that emits red light having a wavelength λ of 640 nm, the green light-emitting layer EMg that emits green light having a wavelength λ of 530 nm, and the blue light-emitting layer EMb that emits blue light having a wavelength λ of 450 nm are formed of Cd(Zn)S, the lowest unoccupied molecular orbital (LUMO) of the red light-emitting layer EMr is −4.3 eV, and the highest occupied molecular orbital (HOMO) is −6.2 eV. LUMO and HOMO of the green light-emitting layer EMg are −3.9 eV and −6.2 eV, respectively. LUMO and HOMO of the blue light-emitting layer EMb are −3.4 eV and −6.2 eV, respectively.

Figure 12:
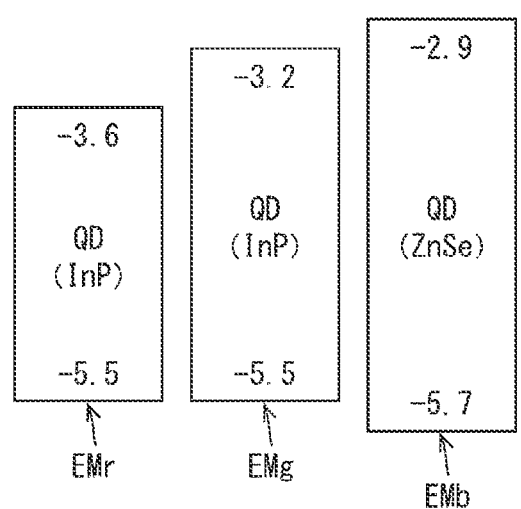
FIG. 12 is a diagram illustrating an example of energy levels of non-Cd-based quantum dots of the light-emitting layers.

FIG. 12 is a diagram illustrating an example of energy levels of the non-Cd-based quantum dots of the red light-emitting layer EMr, the green light-emitting layer EMg, and the blue light-emitting layer EMb. In a case where the quantum dots of the red light-emitting layer EMr and the green light-emitting layer EMg are formed of InP and the quantum dots of the blue light-emitting layer EMb is formed of ZnSe, LUMO and HOMO of the red light-emitting layer EMr are −3.6 eV, and −5.5 eV, respectively. Furthermore, LUMO and HOMO of the green light-emitting layer EMg are 3.2 eV and −5.5 eV, respectively. LUMO and HOMO of the blue light-emitting layer EMb are −2.9 eV and −5.7 eV, respectively.

Figure 13:
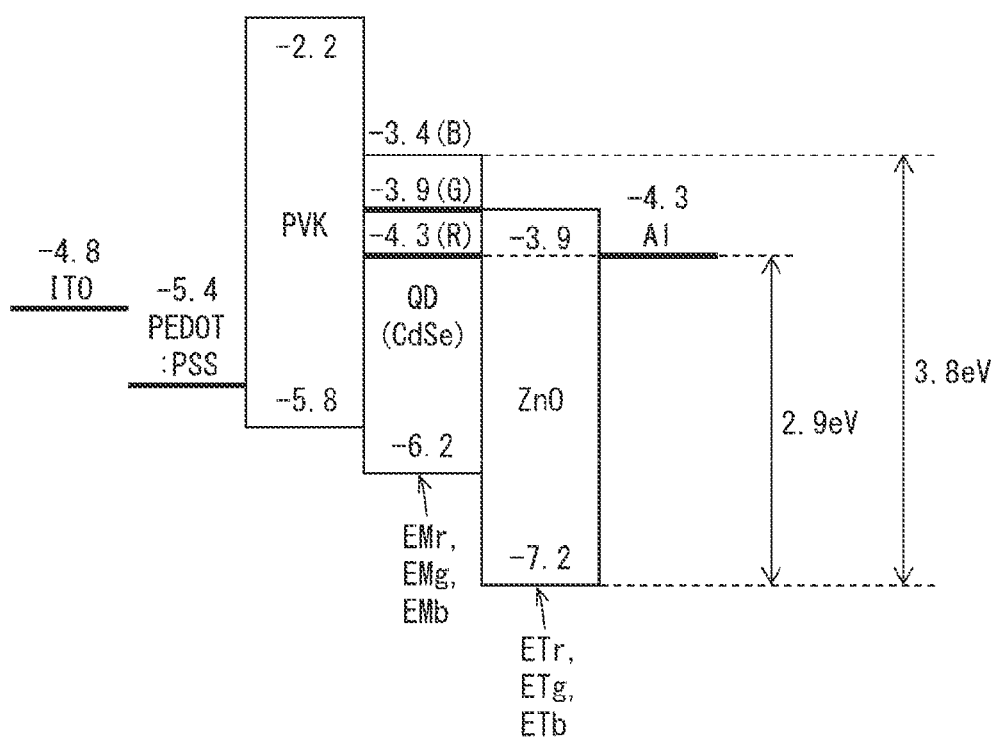
FIG. 13 is a diagram illustrating an example of energy levels of a QLED element provided in the display device.

FIG. 13 is a diagram illustrating an example of energy levels of a QLED element provided in the display device 2. HOMOs of the red light-emitting layer EMr, the green light-emitting layer EMg, and the blue light-emitting layer EMb formed of the Cd-based quantum dots are −6.2 eV, LUMO of the red light-emitting layer EMr is −4.3 eV, and LUMO of the green light-emitting layer EMg is −3.9 eV, and LUMO of the blue light-emitting layer EMb is −3.4 eV.

LUMO and HOMO of the electron transport layers ETr, ETg, and ETb formed of ZnO are −3.9 eV and −7.2 eV, respectively. The energy level of the common electrode KE formed of Al is −4.3 eV.

Thus, difference between HOMO of the electron transport layers ETr, ETg, and ETb and LUMO of the red light-emitting layer EMr is 2.9 eV, and difference between HOMO of the electron transport layers ETr, ETg, and ETb and LUMO of the blue light-emitting layer EMb is 3.8 eV.

LUMO and HOMO of the hole transport layer HT formed of polyvinyl carbazole (PVK) are −2.2 eV and 58 eV respectively. The energy level of the hole injection layer formed of poly(3,4-ethylenedioxythiophene):poly(4-styrenesulfonic acid) (PEDOT:PSS) is −5.4 eV. The energy level of the pixel electrodes PEr, PEg, and PEb formed of ITO is −4.8 eV.

Figure 14:
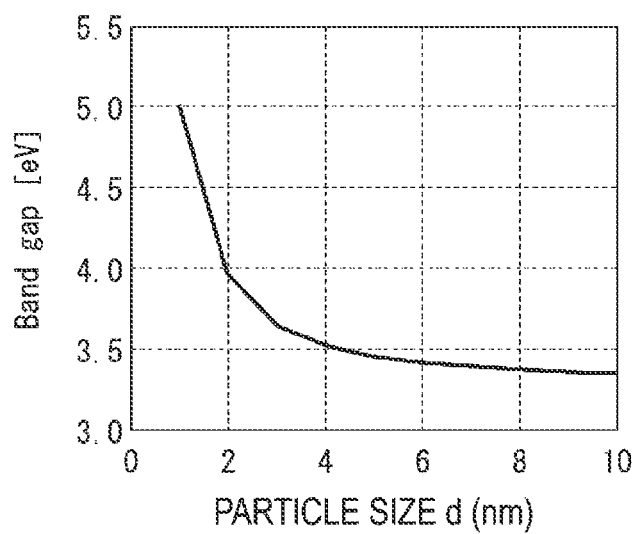
FIG. 14 is a graph showing a band gap of ZnO nanoparticles in the display device.

FIG. 14 is a graph showing a band gap of ZnO nanoparticles of the electron transport layers ETr, ETg, and ETb provided in the display device 2. The horizontal axis indicates the particle size of ZnO nanoparticles, and the vertical axis indicates the band gap of ZnO nanoparticles. As the particle size of ZnO nanoparticles is smaller than 10 nm, the band gap of ZnO nanoparticles exponentially increases from 3.4 eV which is the band gap value of a bulk crystal.

As described above, the electron transport layers ETr, ETg, and ETb are not the isolated patterns, but are the continuous patterns in the non-light-emitting region NL, and are patterns including the openings Org, Orb, Ogr, Ogb, Obg, and Obr at locations corresponding to the subpixels of other luminescent colors. The electron transport layers ETr, ETg, and ETb are formed of materials optimal for the subpixels SPr, SPg, and SPb, respectively. As described above, the electron transport layers ETr ETg, and ETb formed of the materials optimal for subpixels SPr, SPg, and SPb, respectively are bonded to the red light-emitting layer EMr, the green light-emitting layer EMg, and the blue light-emitting layer EMb, respectively. As a result, a display device provided with a light-emitting element having high light-emitting efficiency can be realized.

Further, the electron transport layers ETr, ETg, and ETb are continuously formed across the entirety of the subpixels SPr, SPg, and SPb, not in an isolated pattern. Thus, in the electron transport layers ETr, ETg, and ETb, chipping and peeling at the pixel edge portion are less likely to occur. In addition, when chipping and peeling occur at the pixel edge portion in the function layer, uneven light emission in the surface can be caused, but when the function layer is continuously formed across the subpixel not in the isolated pattern, such uneven light emission can be suppressed.

In the example of the above-described embodiment, the example is described in which the electron transport layers ETr, ETg and ETb are formed between the red light-emitting layer EMr, the green light-emitting layer EMg, and the blue light-emitting layer EMb, and the common electrode KE, but the disclosure is not limited to this example. The electron transport layers ETr, ETg, and ETb may be respectively formed between the pixel electrodes PEr, PEg, and PEb and the red light-emitting layer EMr, the green light-emitting layer EMg, and the blue light-emitting layer EMb.

In the example of the above-described embodiment, the example of patterning the electron transport layers ETr, ETg, and ETb is described, but the disclosure is not limited to this example. Not only the electron transport layers ETr, ETg, and ETb but also the red light-emitting layer EMr, the green light-emitting layer EMg, and the blue light-emitting layer EMb may be patterned in the same manner. Furthermore, the hole transport layer HT (fourth function layer) may be separately patterned in accordance with the red light-emitting layer EMr, the green light-emitting layer EMg, and the blue light-emitting layer EMb. The hole transport layer HT is formed on the opposite side of the electron transport layers ETr, ETg, and ETb with respect to the red light-emitting layer EMr, the green light-emitting layer EMg, and the blue light-emitting layer EMb. At patterning the hole transport layer HT, a photolithography method and an imprint method using a mixture of NiO nanoparticles and photosensitive resin, and a photocurable hole transport material can be used. As the photocurable hole transport material, X-F6-TAPC, QUPD, OTPD, or the like can be used.

At patterning the red light-emitting layer EMr, when the green light-emitting layer EMg, and the blue light-emitting layer EMb, any of the red light-emitting layer EMr, the green light-emitting layer EMg, and the blue light-emitting layer EMb overlap each other in the light-emitting regions Lr, Lg, and Lb, an unintended color might be emitted. Thus, the openings of the patterned red light-emitting layer EMr, green light-emitting layer EMg, and blue light-emitting layer EMb are preferably widened.

In contrast, even when the electron transport layers ETr, ETg, and ETb overlap each other in the light-emitting regions Lr, Lg, and Lb, the color of emitted light is not significantly affected. Thus, the openings of the patterned red light-emitting layer EMr, green light-emitting layer EMg, and blue light-emitting layer EMb are preferably larger than the openings of the patterned electron transport layers ETr, ETg, and ETb.

Second Embodiment

Figure 15:
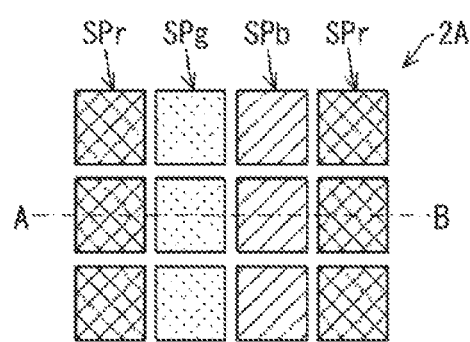
FIG. 15 is a plan view illustrating an arrangement of subpixels provided in a display device according to a second embodiment.
Figure 16:
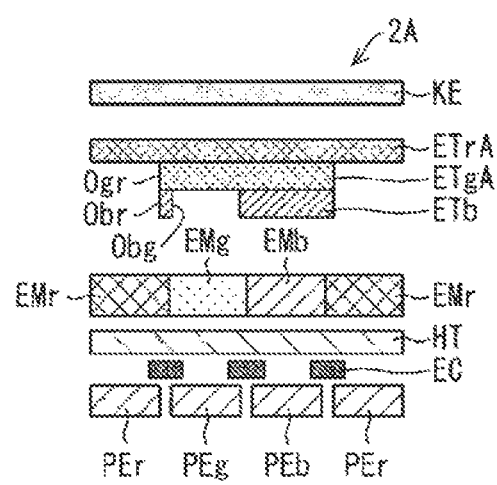
FIG. 16 is a cross-sectional view taken along a plane A-B illustrated in FIG. 15.
Figure 17:
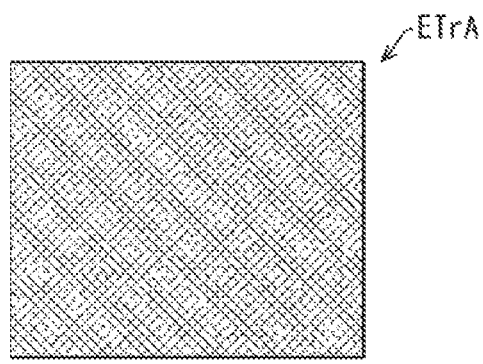
FIG. 17 is a plan view illustrating a pattern of an electron transport layer for a red light-emitting layer provided in the display device.
Figure 18:
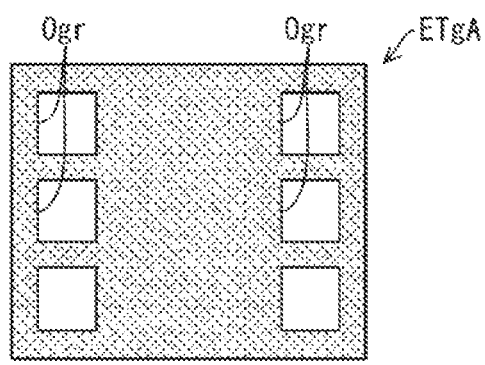
FIG. 18 is a plan view illustrating a pattern of an electron transport layer for a green light-emitting layer provided in the display device.
Figure 19:
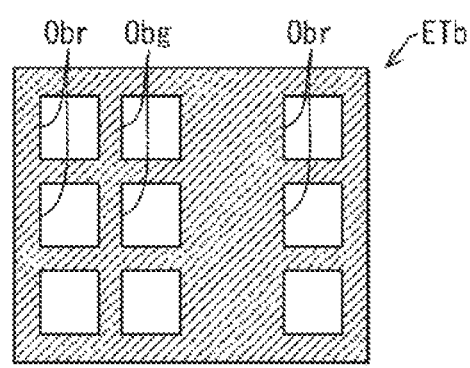
FIG. 19 is a plan view illustrating a pattern of an electron transport layer for a blue light-emitting layer provided in the display device.

FIG. 15 is a plan view illustrating an arrangement of subpixels SPr, SPg, and SPb provided in a display device 2A according to a second embodiment. FIG. 16 is a cross-sectional view taken along a plane A-B illustrated in FIG. 15. FIG. 17 is a plan view illustrating a pattern of an electron transport layer ETrA for the red light-emitting layer EMr provided in the display device 2A. FIG. 18 is a plan view illustrating a pattern of an electron transport layer ETgA for the green light-emitting layer EMg provided in the display device 2A. FIG. 19 is a plan view illustrating a pattern of the electron transport layer ETb for the blue light-emitting layer EMb provided in the display device 2A. Constituent elements similar to the constituent elements described above are given the same reference numerals, and detailed descriptions thereof are not repeated.

The electron transport layer ETrA is suitable for the red light-emitting layer EMr. The electron transport layer ETrA is not patterned, and overlaps the entirety of all of the pixel electrodes PEr, PEg, and PEb.

The electron transport layer ETgA is suitable for the green light-emitting layer EMg, and is patterned so as to include the opening Ogr for not covering the pixel electrode PEr.

The electron transport layer ETb is suitable for the blue light-emitting layer EMb, and is patterned so as to include the opening Obr for not covering the pixel electrode PEr and the opening Obg for not covering the pixel electrode PEg.

The electron transport layer ETb, the electron transport layer ETgA, and the electron transport layer ETrA are layered in this order. That is, the electron transport layer ETb, the electron transport layer ETgA, the electron transport layer ETrA, and the cathode electrode are layered in this order from the light-emitting layer.

Figure 20:
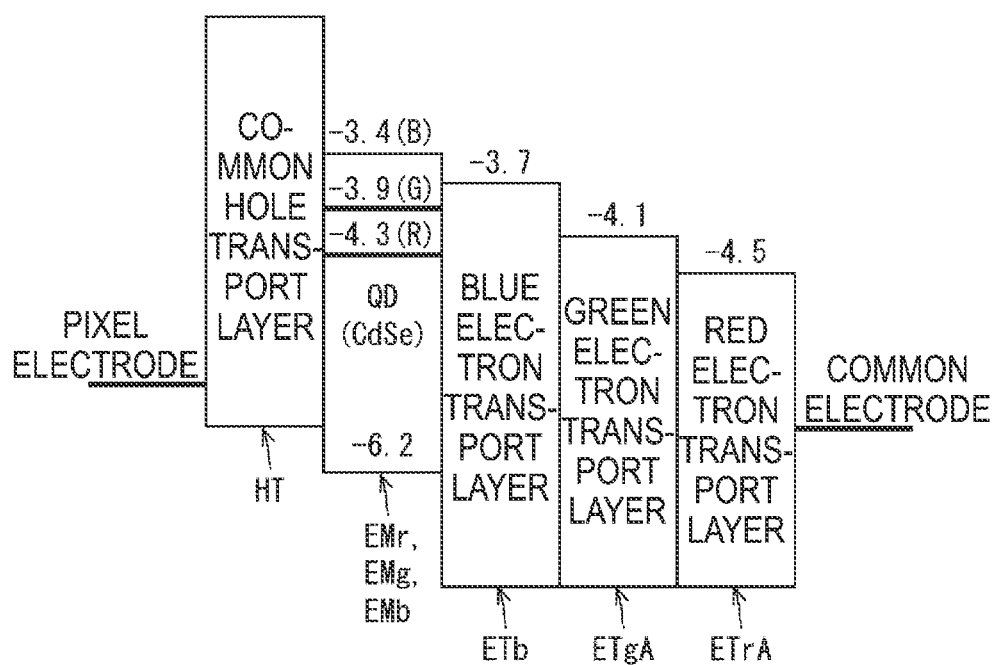
FIG. 20 is a diagram illustrating an example of energy levels of the light-emitting layers.

FIG. 20 is a diagram illustrating an example of energy levels of the light-emitting layers provided in the display device 2A. HOMOs of the electron transport layer ETrA, the electron transport layer ETgA, and the electron transport layer ETb are common and equal to each other. LUMO of the electron transport layer ETrA is −4.5 eV, which is lower than LUMO of −4.3 eV of the red light-emitting layer EMr. LUMO of the electron transport layer ETgA is −4.1 eV, which is lower than LUMO of −3.9 eV of the green light-emitting layer EMg. LUMO of the electron transport layer ETb is −3.7 eV, which is lower than LUMO of −3.4 eV of the blue light-emitting layer EMb.

The first color emitted by the blue light-emitting layer EMb is blue, the third color emitted by the red light-emitting layer EMr is red, the common electrode KE is the cathode, and the electron transport layer ETb (first function layer) and the electron transport layer ETrA (third function layer) are formed between the red light-emitting layer EMr, the green light-emitting layer EMg, and the blue light-emitting layer EMb, and the common electrode KE. The electron transport layer ETrA is closer to the common electrode KE than the electron transport layer ETgA. The energy levels are lower in the order of −3.4 eV which is the conduction band end (LUMO) of the blue light-emitting layer EMb, −4.1 eV which is the conduction band end (LUMO) of the electron transport layer ETgA (second function layer), and −4.5 eV which is the conduction band end (LUMO) of the electron transport layer ETrA (third function layer.

Figure 21:
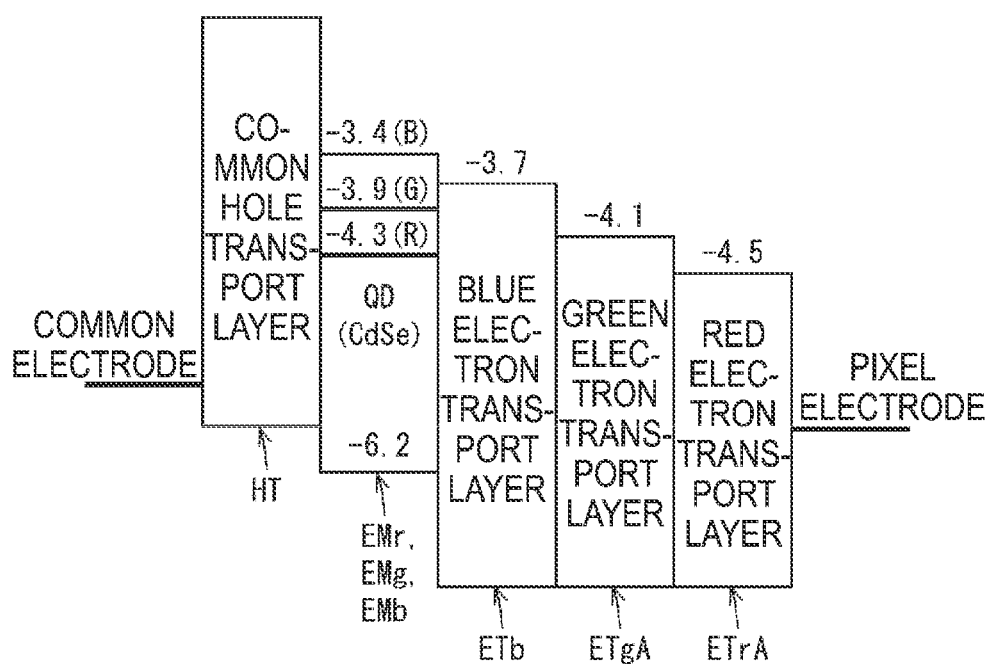
FIG. 21 is a diagram illustrating an example of energy levels according to a modified example of the light-emitting layers.

FIG. 21 is a diagram illustrating an example of energy levels according to a modified example of the light-emitting layer. The first color emitted by the blue light-emitting layer EMb is blue, the third color emitted by the red light-emitting layer EMr is red, the second color emitted by the green light-emitting layer EMg is green, the pixel electrodes PEr, PEg, and PEb are cathodes, and the electron transport layer ETb (first function layer), the electron transport layer ETrA (third function layer), and the electron transport layer ETgA (second function layer) are formed between the red light-emitting layer EMr, the green light-emitting layer EMg, and the blue light-emitting layer EMb and the pixel electrodes PEr, PEg, and PEb. The electron transport layer ETgA (second function layer) is closer to the pixel electrode than the electron transport layer ETb (first function layer), and the electron transport layer ETrA (first function layer) is closer to the pixel electrode than the electron transport layer ETgA (second function layer). The energy levels are lower in the order of −3.4 eV which is the conduction band end (LUMO) of the blue light-emitting layer EMb, −3.7 eV which is the conduction band end (LUMO) of the electron transport layer ETb (first function layer), −4.1 eV which is the conduction band end (LUMO) of the electron transport layer ETgA (second function layer), and −4.5 eV which is the conduction band end (LUMO) of the electron transport layer ETrA (third function layer).

Third Embodiment

Figure 22:
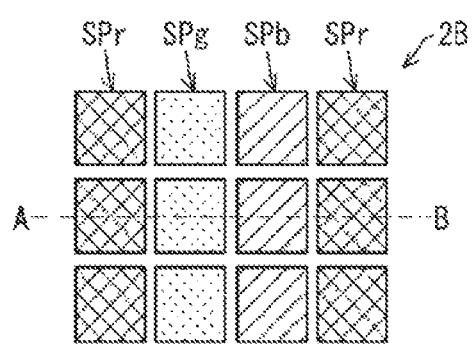
FIG. 22 is a plan view illustrating an arrangement of subpixels provided in a display device according to a third embodiment.
Figure 23:
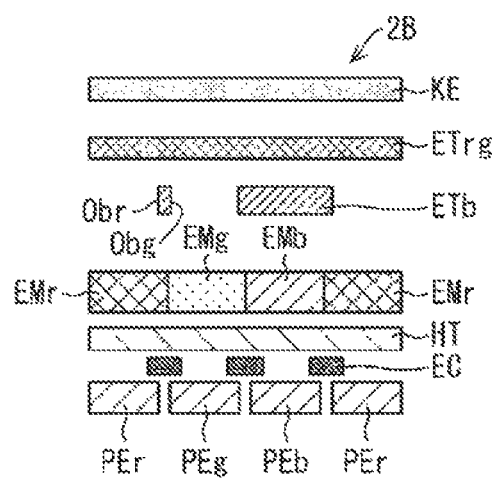
FIG. 23 is a cross-sectional view taken along a plane A-B illustrated in FIG. 22.
Figure 24:
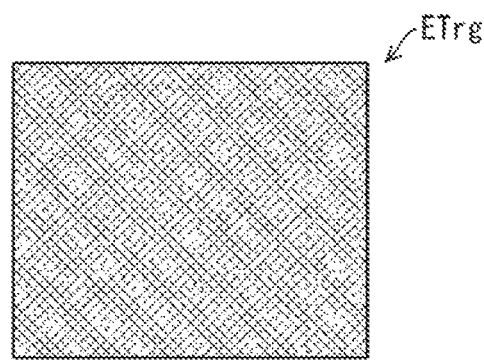
FIG. 24 is a plan view illustrating a pattern of an electron transport layer for the red light-emitting layer and the green light-emitting layer provided in the display device.
Figure 25:
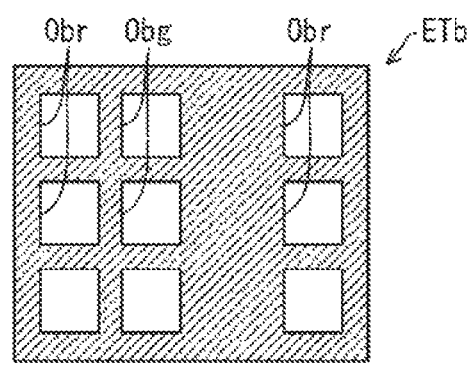
FIG. 25 is a plan view illustrating a pattern of an electron transport layer for a blue light-emitting layer provided in the display device.

FIG. 22 is a plan view illustrating an arrangement of subpixels SPr, SPg, and SPb provided in a display device 2B according to a third embodiment. FIG. 23 is a cross-sectional view taken along a plane A-B illustrated in FIG. 22. FIG. 24 is a plan view illustrating a pattern of an electron transport layer ETrg for the red light-emitting layer EMr and the green light-emitting layer EMg provided in the display device 2B. FIG. 25 is a plan view illustrating a pattern of the electron transport layer ETb for the blue light-emitting layer EMb provided in the display device 2B. Constituent elements similar to the constituent elements described above are given the same reference numerals, and detailed descriptions thereof are not repeated.

The electron transport layer ETrg is suitable for the red light-emitting layer EMr and the green light-emitting layer EMg. The electron transport layer ETrg is not patterned and overlaps the entirety of all of the pixel electrodes PEr, PEg, and PEb.

The electron transport layer ETb is suitable for the blue light-emitting layer EMb, and is patterned so as to include the opening Obr for not covering the pixel electrode PEr and the opening Obg for not covering the pixel electrode PEg. The electron transport layer ETb, and the electron transport layer ETrg are layered in this order. That is, the electron transport layer ETb, the electron transport layer ETrg, and the cathode electrode are layered in this order from the light-emitting layer.

As described above, in the third embodiment, the same electron transport layer ETrg is in contact with the red light-emitting layer EMr and the green light-emitting layer EMg different from each other.

Figure 26:
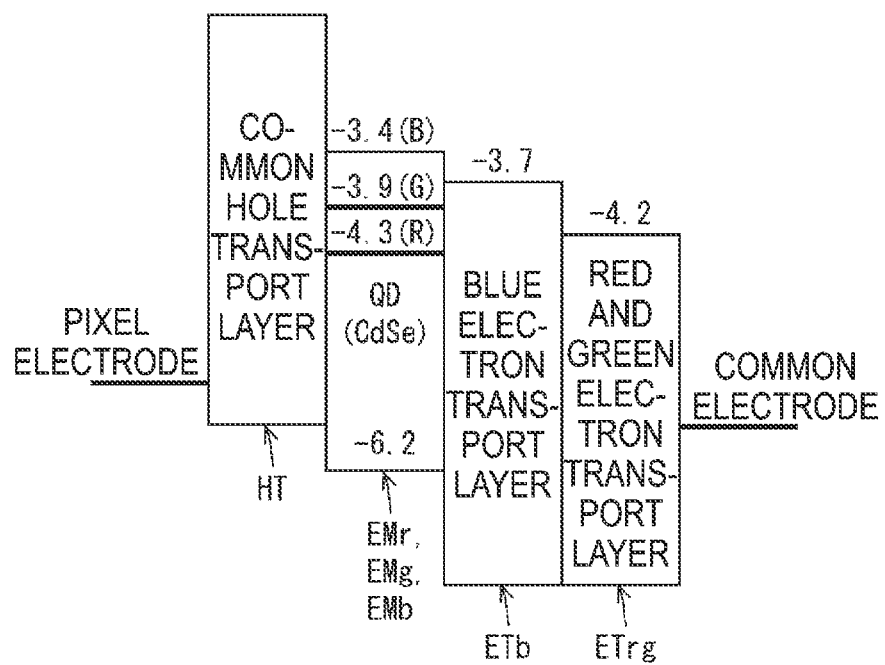
FIG. 26 is a diagram illustrating an example of energy levels of the light-emitting layers.

FIG. 26 is a diagram illustrating an example of energy levels of the light-emitting layers provided in the display device 2B. HOMOs of the electron transport layer ETrg, and the electron transport layer ETb are common. LUMO of the electron transport layer ETrg is −4.2 eV, which is lower than LUMO of −3.9 eV of the green light-emitting layer EMg. LUMO of the electron transport layer ETb is −3.7 eV, which is lower than LUMO of −3.4 eV of the blue light-emitting layer EMb.

Fourth Embodiment

Figure 27:
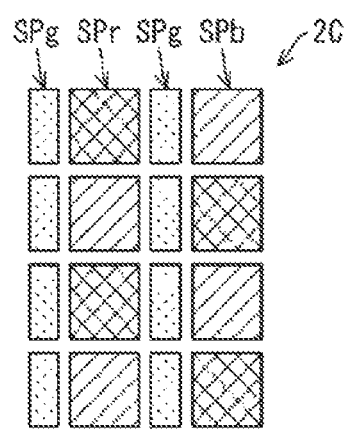
FIG. 27 is a plan view illustrating another arrangement of subpixels provided in the display device.
Figure 28:
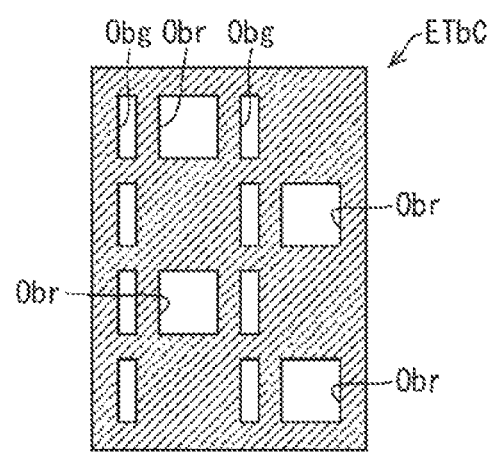
FIG. 28 is a plan view illustrating a pattern of an electron transport layer for the blue light-emitting layer provided in the display device.
Figure 29:
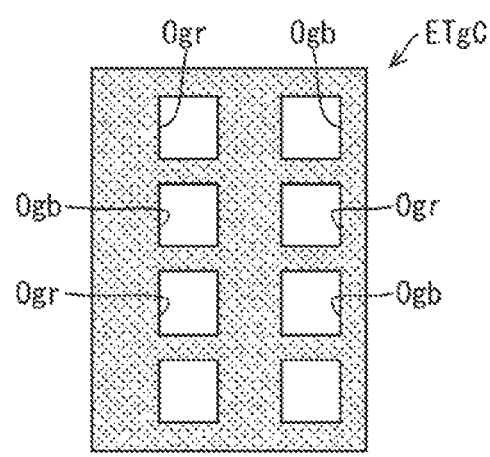
FIG. 29 is a plan view illustrating a pattern of an electron transport layer for the green light-emitting layer provided in the display device.
Figure 30:
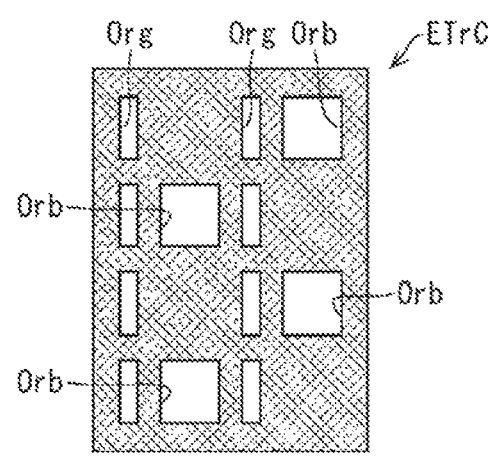
FIG. 30 is a plan view illustrating a pattern of an electron transport layer for the red light-emitting layer provided in the display device.

FIG. 27 is a plan view illustrating an arrangement of subpixels SPr, SPg, and SPb provided in a display device 2C according to a fourth embodiment. FIG. 28 is a plan view illustrating a pattern of an electron transport layer ETbC for the blue light-emitting layer EMb provided in the display device 2C. FIG. 29 is a plan view illustrating a pattern of an electron transport layer ETgC for the green light-emitting layer EMg provided in the display device 2C. FIG. 30 is a plan view illustrating a pattern of an electron transport layer ETrC for the red light-emitting layer EMr provided in the display device 2C. Constituent elements similar to the constituent elements described above are given the same reference numerals, and detailed descriptions thereof are not repeated.

In a simple striped pixel arrangement illustrated in FIGS. 5, 15, and 22, each of the subpixels SPr, SPg, and SPb is arranged in the same cycle and the same pattern. In contrast, the subpixels SPr, SPg, and SPb illustrated in FIG. 27 are arranged in the PenTile form. In such an arrangement other than the simple striped pixel arrangement, each subpixel SPr, SPg, and SPb is arranged in different periods and different patterns from each other.

As illustrated in FIG. 28, in the electron transport layer ETbC (first function layer), a shape of the opening Obg that overlaps the inner side of the peripheral edge portion of the pixel electrode PEg of the subpixel SPg (second subpixel) in a plan view and a shape of the opening Obr that overlaps the inner side of the peripheral edge portion of the pixel electrode PEr of the subpixel SPr (third subpixel) in a plan view are different from each other.

As illustrated in FIG. 29, in the electron transport layer ETgC (second function layer), a shape of the opening Obg that overlaps the inner side of the peripheral edge portion of the pixel electrode PEb of the subpixel SPb (first subpixel) in a plan view and a shape of the opening Obr that overlaps the inner side of the peripheral edge portion of the pixel electrode PEr of the subpixel SPr (third subpixel) in a plan view are different from each other.

As illustrated in FIG. 30, in the electron transport layer ETrC (third function layer), a shape of the opening Org that overlaps the inner side of the peripheral edge portion of the pixel electrode PEg of the subpixel SPg (second subpixel) in a plan view and a shape of the opening Orb that overlaps the inner side of the peripheral edge portion of the pixel electrode PEb of the subpixel SPb (first subpixel) in a plan view are different from each other.

Figure 31:
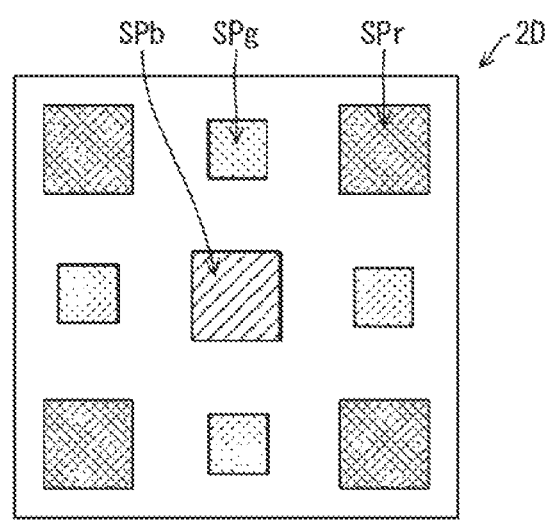
FIG. 31 is a plan view illustrating a still another arrangement of subpixels provided in the display device.
Figure 32:
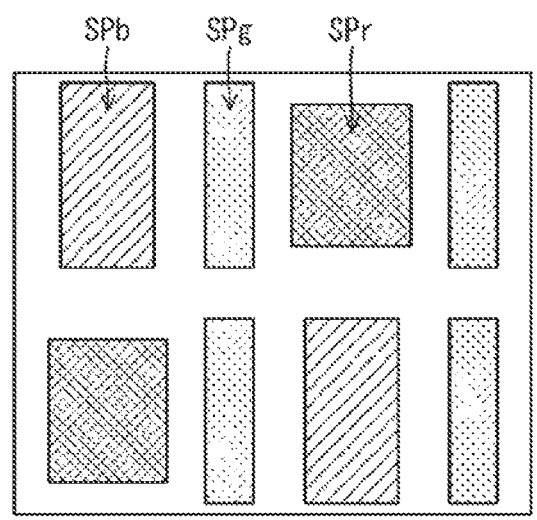
FIG. 32 is a plan view illustrating still another arrangement of the subpixels.
Figure 33:
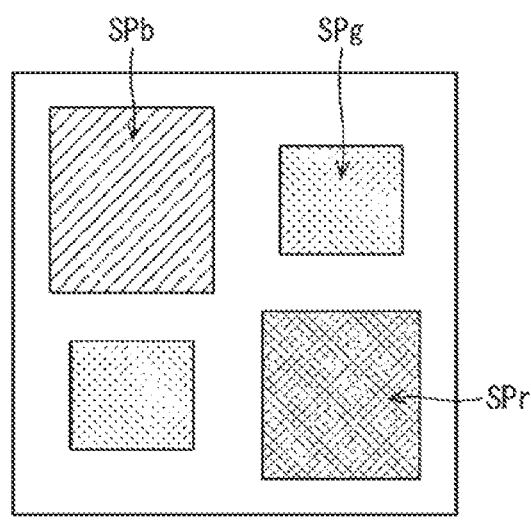
FIG. 33 is a plan view illustrating still another arrangement of the subpixels.
Figure 34:
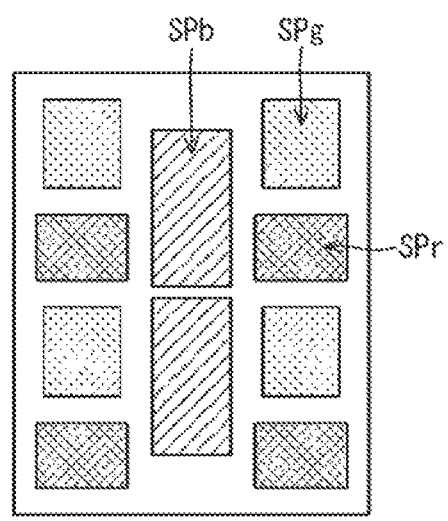
FIG. 34 is a plan view illustrating still another arrangement of the subpixels.

FIG. 31 is a plan view illustrating an arrangement of subpixels SPr, SPg, and SPb provided in a display device 2D according to the fourth embodiment. FIGS. 32 to 34 are plan views illustrating other arrangements of the subpixels SPr, SPg, and SPb. Constituent elements similar to the constituent elements described above are given the same reference numerals, and detailed descriptions thereof are not repeated.

The openings of the electron transport layers ETr, ETg, and ETb patterned according to the arrangement of the subpixels SPr, SPg, and SPb illustrated in FIGS. 31 to 34 differ according to the luminescent colors of the light-emitting layers corresponding to the respective electron transport layers ETr, ETg, and ETb.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

For example, the above-described embodiments of the disclosure indicates the case where the three colors are mainly used, regarding the lengths of the wavelengths of the first color, the second color, and the third color, the first color has the shortest wavelength, the third color has the longest wavelength, the first color is blue, the second color is green, and the third color is red, but the disclosure is not limited thereto. That is, the embodiments are applicable to a case where a plurality of different colors are used, such as when only two colors are used without the third color, and the first color has a shorter wavelength than the second color (for example, a case where the first color is blue and the second color is red, a case where the first color is green and the second color is red, a case where the first color is blue and the second color is yellow, or the like).

The invention claimed is:
1. A display device comprising:
a plurality of subpixels arranged in a matrix;
a pixel electrode formed for each of the plurality of subpixels;
a common electrode formed across the plurality of subpixels;
a light-emitting layer formed between the pixel electrode and the common electrode; and
a first function layer and a second function layer formed between the light-emitting layer and the pixel electrode or between the light-emitting layer and the common electrode, the first function layer and the second function layer continuously formed all across the plurality of subpixels,
wherein the plurality of subpixels includes a first subpixel configured to emit a first color light and a second subpixel configured to emit a second color light having a wavelength longer than a wavelength of the first color light,
the first function layer includes a first opening positioned in a center of the pixel electrode of the second subpixel in a plan view,
the second function layer overlaps an entirety of the pixel electrode of the second subpixel in the plan view, and
the first function layer overlaps, in the plan view, an entirety of the pixel electrode of the first subpixel and an inner side of a peripheral edge portion of the pixel electrode of the second subpixel.

2. The display device according to claim 1,
wherein the plurality of subpixels further includes a third subpixel configured to emit a third color light having a wavelength longer than the wavelength of the second color light,
the first function layer further includes a second opening positioned in a center of the pixel electrode of the third subpixel in the plan view, and
the first function layer further overlaps, in the plan view, an inner side of a peripheral edge portion of the pixel electrode of the third subpixel.

3. The display device according to claim 2,
wherein a shape of the first opening positioned in the center of the pixel electrode of the second subpixel and a shape of the second opening positioned in the center of the pixel electrode of the third subpixel are different from each other.

4. The display device according to claim 1,
wherein the plurality of subpixels further includes a third subpixel configured to emit a third color light having a wavelength longer than the wavelength of the second color light, and
the second function layer further overlaps the entirety of the pixel electrode of the first subpixel and overlaps an entirety of the pixel electrode of the third subpixel, in the plan view.

5. The display device according to claim 1,
wherein the plurality of subpixels further includes a third subpixel configured to emit a third color light having a wavelength longer than the wavelength of the second color light,
the second function layer includes a second opening positioned in a center of the pixel electrode of the first subpixel in the plan view, and a third opening positioned in a center of the pixel electrode of the third subpixel in the plan view, and
the second function layer further overlaps an inner side of a peripheral edge portion of the pixel electrode of the first subpixel and overlaps an inner side of a peripheral edge portion of the pixel electrode of the third subpixel, in the plan view.

6. The display device according to claim 1,
wherein the plurality of subpixels further includes a third subpixel configured to emit a third color light having a wavelength longer than the wavelength of the second color light,
the second function layer includes a second opening positioned in a center of the pixel electrode of the third subpixel in the plan view, and
the second function layer further overlaps, in the plan view, the entirety of the pixel electrode of the first subpixel and an inner side of a peripheral edge portion of the pixel electrode of the third subpixel.

7. The display device according to claim 1,
wherein the plurality of subpixels further includes a third subpixel configured to emit a third color light having a wavelength longer than the wavelength of the second color light,
the second function layer includes a second opening positioned in a center of the pixel electrode of the first subpixel in the plan view, and
the second function layer further overlaps, in the plan view, an entirety of the pixel electrode of the third subpixel and an inner side of a peripheral edge portion of the pixel electrode of the first subpixel.

8. The display device according to claim 1, wherein
the plurality of subpixels further includes a third subpixel configured to emit a third color light having a wavelength longer than the wavelength of the second color light,
the display device further comprises a third function layer formed between the light-emitting layer and the pixel electrode or between the light-emitting layer and the common electrode, and continuously formed all across the plurality of the subpixels, and
the third function layer overlaps an entirety of the pixel electrode of the third subpixel in the plan view.

9. The display device according to claim 8,
wherein the first function layer is stacked to be adjacent to at least one of the second function layer or the third function layer.

10. The display device according to claim 8,
wherein the third function layer further overlaps an entirety of the pixel electrode of the first subpixel and overlaps an entirety of the pixel electrode of the second subpixel, in the plan view.

11. The display device according to claim 8,
wherein the third function layer includes a second opening positioned in a center of the pixel electrode of the first subpixel in the plan view, and
the third function layer further overlaps, in the plan view, an inner side of a peripheral edge portion of the pixel electrode of the first subpixel and the entirety of the pixel electrode of the second subpixel.

12. The display device according to claim 8,
wherein the third function layer includes a second opening positioned in a center of the pixel electrode of the second subpixel in the plan view, and
the third function layer further overlaps, in the plan view, the inner side of the peripheral edge portion of the pixel electrode of the second subpixel and an entirety of the pixel electrode of the first subpixel in the plan view.

13. The display device according to claim 8,
wherein the third function layer includes a second opening positioned in a center of the pixel electrode of first subpixel in the plan view, and a third opening positioned in the center of the pixel electrode of the second subpixel in the plan view, and
the third function layer further overlaps, in the plan view, an inner side of a peripheral edge portion of the pixel electrode of the first subpixel and the inner side of the peripheral edge portion of the pixel electrode of the second subpixel.

14. The display device according to claim 13,
wherein a shape of the third opening positioned in the center of the pixel electrode of the second subpixel and a shape of the second opening positioned in the center of the pixel electrode of the first subpixel are different from each other.

15. The display device according to claim 8,
wherein the first function layer further overlaps an entire periphery of the peripheral edge portion of the pixel electrode of the second subpixel and an entire periphery of a peripheral edge portion of the pixel electrode of the third subpixel in the plan view,
the second function layer further overlaps an entire periphery of a peripheral edge portion of the pixel electrode of the first subpixel and the entire periphery of the peripheral edge portion of the pixel electrode of the third subpixel, in the plan view, and
the third function layer overlaps the entire periphery of the peripheral edge portion of the pixel electrode of the first subpixel and the entire periphery of the peripheral edge portion of the pixel electrode of the second subpixel, in the plan view.

16. The display device according to claim 8,
wherein each of the first function layer, the second function layer, and the third function layer is an electron transport layer containing zinc oxide compound nanoparticles, and
a particle size and the electron affinity increases, in an order of the zinc oxide compound nanoparticles contained in the first function layer, the zinc oxide compound nanoparticles contained in the second function layer, and the zinc oxide compound nanoparticles contained in the third function layer.

17. The display device according to claim 1, further comprising:
a fourth function layer formed:
between the light-emitting layer and the pixel electrode or between the light-emitting layer and the common electrode, and
on a side of the light-emitting layer opposite the first function layer,
wherein the fourth function layer includes a second opening positioned in the center of the pixel electrode of the second subpixel in the plan view, and
the fourth function layer overlaps, in the plan view, the entirety of the pixel electrode of the first subpixel, and the inner side of the peripheral edge portion of the pixel electrode of the second subpixel in the plan view.

18. The display device according to claim 17,
wherein the first function layer and the second function layer are electron transport layers, and the fourth function layer is a hole transport layer.

19. The display device according to claim 1,
wherein the first function layer further overlaps an entire periphery of the peripheral edge portion of the pixel electrode of the second subpixel in the plan view, and
the second function layer further overlaps an entire periphery of a peripheral edge portion of the pixel electrode of the first subpixel in the plan view.

20. The display device according to claim 1, wherein the plurality of subpixels is arranged in a PenTile form.

\* \* \* \* \*